United States Patent
Speckbacher et al.

(10) Patent No.: US 7,719,075 B2
(45) Date of Patent: May 18, 2010

(54) SCANNING HEAD FOR OPTICAL POSITION-MEASURING SYSTEMS

(75) Inventors: Peter Speckbacher, Kirchweidach (DE); Josef Weidmann, Trostberg (DE); Christopher Eisele, Traunwalchen (DE); Elmar Mayer, Nussdorf (DE); Reiner Burgschat, Jena (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 690 days.

(21) Appl. No.: 10/582,661

(22) PCT Filed: Jul. 29, 2004

(86) PCT No.: PCT/EP2004/008483
§ 371 (c)(1),
(2), (4) Date: Apr. 27, 2007

(87) PCT Pub. No.: WO2005/057668
PCT Pub. Date: Jun. 23, 2005

(65) Prior Publication Data
US 2007/0278486 A1 Dec. 6, 2007

(30) Foreign Application Priority Data
Dec. 10, 2003 (DE) .................. 103 57 654

(51) Int. Cl.
*H01L 31/105* (2006.01)
*G01D 5/34* (2006.01)

(52) U.S. Cl. .............. 257/458; 257/432; 257/656; 257/E31.061; 250/237 G; 356/401; 356/616; 359/436; 359/566

(58) Field of Classification Search .............. 257/80–82, 257/432, 443, 458, 656, E31.061; 250/237 G; 356/399–401, 616, 622; 359/436, 566, 572, 359/573
See application file for complete search history.

(56) References Cited

U.S. PATENT DOCUMENTS

| 4,885,622 A | * | 12/1989 | Uchiyama et al. | .............. 257/53 |
| 5,576,537 A | | 11/1996 | Holzapfel et al. | |
| 5,841,134 A | | 11/1998 | Burgschat et al. | |

(Continued)

FOREIGN PATENT DOCUMENTS

DE    1 929 569    12/1969

(Continued)

OTHER PUBLICATIONS

Holzapfel et al., JP1994-145025 (Machine Translation of JP 07146160A).*

(Continued)

*Primary Examiner*—Jerome Jackson, Jr.
*Assistant Examiner*—Yu Chen
(74) *Attorney, Agent, or Firm*—Kenyon & Kenyon LLP

(57) ABSTRACT

A scanning head for an optical position-measuring system includes a receiver grating, formed of photosensitive areas, for the scanning of locally intensity-modulated light of differing wavelengths. The receiver grating is formed from a semiconductor layer stack of a doped p-layer, an intrinsic i-layer and a doped n-layer. The individual photosensitive areas have a first doped layer and at least a part of the intrinsic layer in common and are electrically separated from one another by interruptions in the second doped layer.

20 Claims, 9 Drawing Sheets

U.S. PATENT DOCUMENTS

| | | |
|---|---|---|
| 6,603,114 B1 | 8/2003 | Holzapfel et al. |
| 6,759,725 B2 | 7/2004 | Aoki |
| 2001/0054712 A1 | 12/2001 | Aoki |
| 2002/0018220 A1 | 2/2002 | Aoki |
| 2002/0021450 A1 | 2/2002 | Aoki |
| 2004/0036017 A1 | 2/2004 | Ito |
| 2004/0119989 A1 | 6/2004 | Mayer et al. |

FOREIGN PATENT DOCUMENTS

| | | |
|---|---|---|
| DE | 195 27 287 | 1/1997 |
| DE | 198 59 670 | 6/2000 |
| DE | 199 61 250 | 8/2000 |
| DE | 100 37 981 | 2/2001 |
| DE | 101 29 334 | 1/2002 |
| DE | 101 18 796 | 10/2002 |
| EP | 1 182 705 | 2/2002 |
| GB | 1 269 634 | 4/1972 |
| GB | 2 352 810 | 2/2001 |
| JP | 61-229370 | 10/1986 |
| JP | 05-013803 | 1/1993 |
| JP | 07146160 A * | 6/1995 |
| JP | 2003161646 | 6/2003 |
| JP | 2003-227735 | 8/2003 |
| WO | WO 01/84083 | 11/2001 |

OTHER PUBLICATIONS

International Search Report, PCT International Patent Application No. PCT/EP2004/008483, Mar. 16, 2005.

Patent Abstracts of Japan, vol. 2003, No. 12, Dec. 5, 2003.

* cited by examiner

SCANNING HEAD FOR OPTICAL POSITION-MEASURING SYSTEMS

FIELD OF THE INVENTION

The present invention relates to a scanning head for optical position-measuring systems. Such scanning heads are used to detect light modulated by a scale grating in a spatially resolved manner and to make available corresponding signals for the purpose of determining the position of the scanning head relative to the scale.

BACKGROUND INFORMATION

Position-measuring systems play an ever more important role in this increasingly automated world. They furnish the basis for exact positioning of drive systems in many applications, for example, in the field of machine tools. The optical position-measuring systems described herein are based on scanning a scale that has a measuring standard in the form of a line grating. The scanning head used for this includes a light source from which light falls on the scale grating via a transmitting grating. After the interaction with the transmitting grating and the scale grating, the light has a spatial intensity pattern which is able to be detected in the scanning head using a receiving grating and is able to be used for position determination.

It is conventional to form a photodetector from a plurality of photosensitive areas. These photosensitive areas are arranged in the scanning head such that they are able to record the different phases of the intensity pattern and to supply corresponding electrical output signals. The individual, evenly spaced photosensitive areas form a receiving grating, in this context.

Four signals may be generated that are offset by 90 degrees with respect to each other in each case, from which, in a sequential electronic system, counting signals connected with direction may be derived. In response to the shifting of the scale relative to the scanning head, the individual phase-shifted signals change as a function of position.

Usually, from the four output signals mentioned, first of all two signals shifted by 90 degrees with respect to each other and free from offset errors, amplitude errors and phase errors are synthesized, which are suitable for a finer subdivision and interpolation. The counting signals connected with direction are able to permit therewith a substantially finer position determination than would be possible, for example, by counting the maxima and/or minima of the intensity pattern at the photosensitive areas of the scanning head.

For reasons described further on, it may be provided that the individual photosensitive areas are as near as possible to one another. The use of discrete component parts, such as photodiodes, limits the possible miniaturization of the photodetectors. Therefore, structured photodetectors have been implemented which, using conventional process steps of microelectronics, permit the production of structured, photosensitive areas on one single semiconductor substrate.

Because of the low inclination to cross feed between the individual photosensitive areas, in this context, there is available, above all, the technologically well manageable amorphous silicon (a-Si), whose use for converting light to electric current is conventional, for example, in the solar cell field.

German Published Patent Application No. 101 29 334 describes an optical position-measuring system having a light-receiving device based on the principle described above. The photosensitive areas for scanning of locally intensity-modulated light of different phase positions are constructed as receiving gratings in the form of several semiconductor layer stacks of doped and undoped amorphous silicon. The construction of the structured detectors is very complex, however, so that the method for its production is also costly.

SUMMARY

Example embodiments of the present invention may provide a simplified scanning head, compared to the conventional devices, for an optical position-measuring device that supplies signals that are as good as possible for position determination.

A scanning head is described for an optical position-measuring system having a receiving grating formed of photosensitive areas, for scanning locally intensity-modulated light of different phase positions. The receiving grating is formed from a semiconductor layer stack, made up of a doped p-layer, an intrinsic i-layer and a doped n-layer. The individual photosensitive areas have a first doped layer and at least one part of the intrinsic layer in common, and are separated electrically from one another by interruptions in the second doped layer.

It is understood that even the separation of only one of the doped layers may lead to a sufficient electrical separation of the individual photosensitive areas. A cross feed, that is a disadvantage for the purposes of position determination, between areas of a different phase position does not appear any more, even at very slight distances of the individual areas with respect to one another.

On the other hand, such a layer construction also avoids another problem associated with conventional device. If the photosensitive areas are separated also by separating the intrinsic layer (and possibly also the second doped layer), deep trenches are formed which are managed only with difficulty in etching technology. Etching defects in the region of the intrinsic layer are also able to effect defects in the semiconductor material, whereby the photoelectric properties of the individual photosensitive areas are influenced in a very negative manner.

Amorphous silicon may be particularly suitable as semiconductor material, but semiconductor layer stacks are also possible which totally or partly include microcrystalline silicon.

Additional features, such as the positioning of the transmitting grating in the center of area of the receiving grating, an approximately elliptical or oval shape of the receiving grating, which has a greater extension perpendicular to the measuring direction than parallel to it, as well as the obtaining of phase-shifted signals from, in each case, a single period of the modulated light at the receiving grating lead to an optimization of the obtained scanning signals, and thus to an improved interpolation capability, and thus, to a higher resolution of the optical position-measuring system.

The arrangement of the scanning head, and, e.g., of the receiving grating with its photosensitive areas, permits in an elegant manner such optimizations in the layout of the structured detectors.

According to an example embodiment of the present invention, a scanning head for an optical position-measuring system includes a receiving grating including photosensitive areas adapted to scan locally intensity-modulated light of different phase position, the receiving grating including a semiconductor layer stack that includes a doped p layer, an intrinsic i layer and a doped n layer. The photosensitive areas have in common a first of the two doped layers and at least a part of the intrinsic layer and are electrically separated from one another by interruptions of a second of the two doped layers.

Further aspects of example embodiments of the present invention and details pertaining thereto are explained in more detail below in the following description with reference to the appended Figures.

DETAILED DESCRIPTION

Figure 1A:
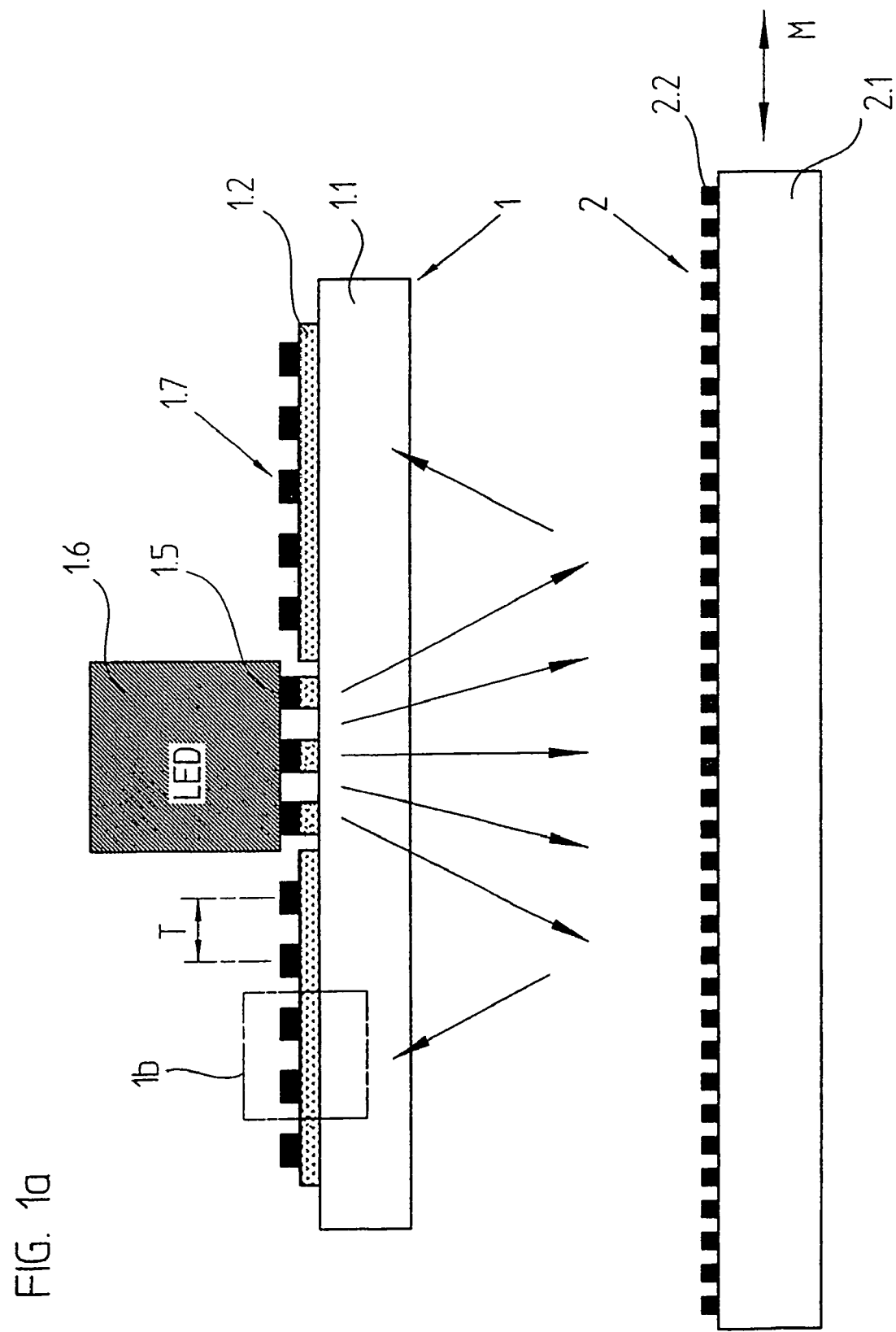
FIGS. 1a to 1c illustrate an optical position-measuring unit.

FIGS. 1a illustrates a scale 2, which carries an optical grating on a substrate 2.1, which is also to be designated as scale grating 2.2. Such a scale grating 2.2 is able to exist, for example, as an amplitude grating having opaque crosspieces made of chromium and light transmitting gaps in the chromium coating. In this context, substrate 2.1 may be developed to be light-transmitting or, as illustrated, reflecting. Other scales 2 are also able to have a phase grating or a combination of phase grating and amplitude grating.

Positioned opposite to the scale is a scanning head 1. scanning head 1 includes a light source 1.6, whose light falls, via a transmitting grating 1.5, on scale 2, is reflected there and redirected to scanning head 1. After the interaction with transmitting grating 1.5 and scale grating 2.2, the light has a local intensity pattern having a regular period. This intensity pattern is detected using a receiving grating 1.7 having a scale division T. In this context, receiving grating 1.7 itself is used as a patterned photodetector for detecting the intensity pattern.

Receiving grating 1.7 has a patterned semiconductor layer stack 1.2 which converts incident light to electric current. In this context, the more current that is generated, the more the light that falls on semiconductor layer stack 1.2.

Figure 1B:
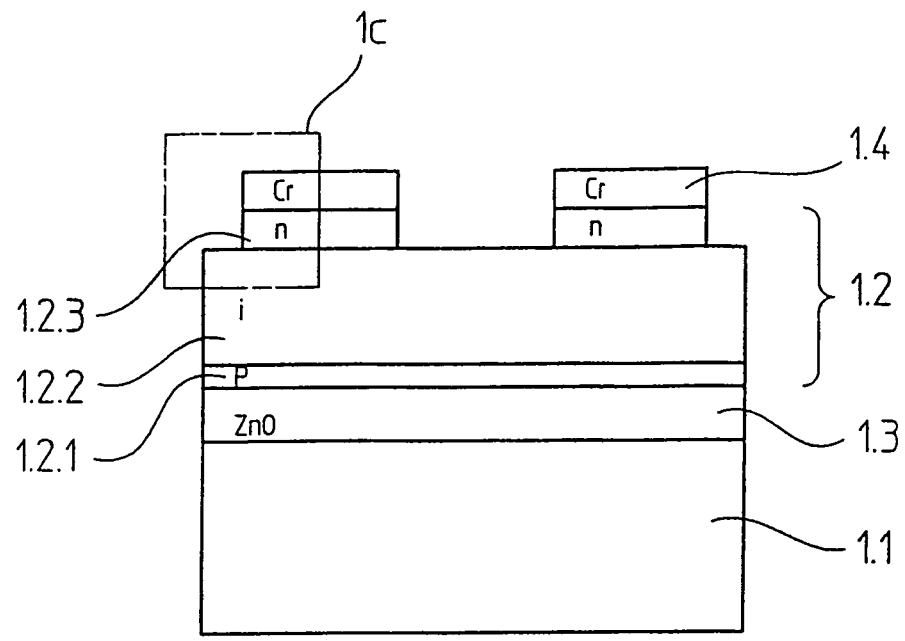

FIG. 1b illustrates an enlarged section of FIG. 1a. One may see substrate 1.1, on which a transparent electrode 1.3 is arranged which, in turn, carries semiconductor layer stack 1.2. In the sequence of the passage of the light, the latter has a first doped (p-doped, in this case) layer 1.2.1 (p-layer), then an intrinsic layer 1.2.2 (i-layer), and a second doped (n-doped, in this case) layer 1.2.3 (n-layer). An electrical bottom contact follows n-layer 1.2.3. In principle, p-layer 1.2.1 and the n-layer may be exchanged, but the construction illustrated in FIG. 1b may be preferred.

The photosensitive areas forming receiving grating 1.7 are separated from one another in that n-layer 1.2.3 having bottom contacts 1.4 are interrupted where a separation of the individual photosensitive areas for detecting the intensity pattern are provided. Only in the region of bottom contacts 1.4 is current generated in semiconductor layer stack 1.2 in response to illumination, and so bottom contact 1.4 defines receiving grating 1.7.

As illustrated in FIG. 1b, the patterning of bottom contact 1.4 and n-layer 1.2.3 is able to take place in a single lithography step and an etching step each for bottom contacts 1.4 and semiconductor layer stack 1.2. As the etching method for semiconductor layer stack 1.2, wet etching methods (e.g., KOH solution) or dry etching methods (e.g., RIE using $CHF_3$) may be used. Such methods are widespread in microelectronics.

Figure 1C:
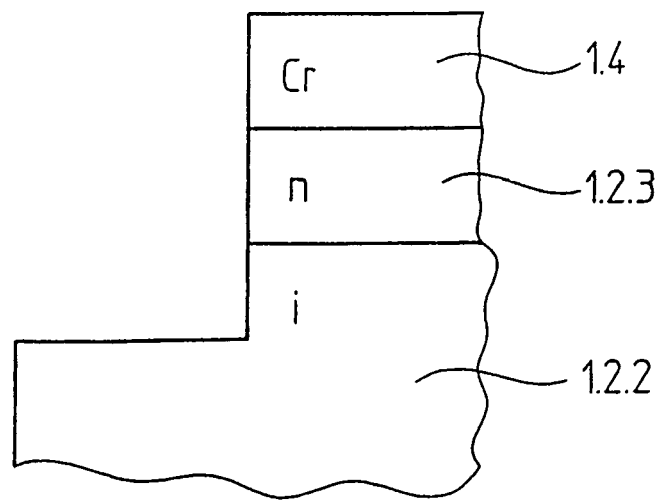

FIG. 1c, another section enlargement of FIG. 1b, illustrates a detail of semiconductor layer stack 1.2. In order to be sure that n-layer 1.2.3 is completely interrupted (e.g., in order to separate the individual photosensitive areas), it may be necessary to set the etching process such that at least a small part of i-layer 1.2.2 is also removed. On the other hand, at least a small part of i-layer 1.2.2 should remain, in order to be certain to prevent an electrical connection between p-layer 1.2.1 and n-layer 1.2.3

The layer construction in the region of receiving grating 1.7 may also be arranged as follows: A layer of ZnO:Al of 0.3 to 1 µm thickness is applied to a glass substrate 1.1 of approximately 1 millimeter thickness, the ZnO:Al layer being well suited to be transparent electrode 1.3. There follows semiconductor layer stack 1.2 having a p-layer 1.2.1 of approximately 10 nm, an i-layer 1.2.2 of approximately 400 nm, and an n-layer 1.2.3 of approximately 20 nm thickness. Bottom contacts 1.4 are made up of a metallic layer of approximately 80 nm thickness, for example, of chromium or aluminum. This metallic layer, in common with n-layer 1.2.3, is completely removed at suitable places for separating the individual photosensitive areas.

Because of the etching process used for separating the photosensitive areas, i-layer 1.2.2 is also taken down by approximately 40 nm, in order to achieve as certain a separation of n-layers 1.2.3 as possible. This may be necessary, since the individual layers are not completely homogeneous with respect to their thickness, and besides, there is no sharply limited transition in the doping profile of semiconductor layer stack 1.2, especially between i-layer 1.2.2 and n-layer 1.2.3. In this connection, it is to be expected that, between photosensitive areas 3, a residual thickness of 5% to 95%, e.g., 10% to 90%, of the original thickness of i-layer 1.2.2 leads to good results. From a manufacturing technology point of view, since shorter etching times are to be preferred, and at greater residual thicknesses of i-layer 1.2.2 problems dealing with defects at the laid-bare bare edge of i-layer 1.2.2 may be avoided, then, in the ranges stated, the upper boundaries (that is, approximately 95% or approximately 90%) may be preferred. For the named layer thickness of 400 nm within photosensitive areas 3, a residual thickness of approximately 360 nm for i-layer 1.2.2 may thus be regarded as being optimal.

It is considered below at what distance apart the individual photosensitive areas have to be positioned in order to receive the desired phase-shifted signals. This distance corresponds to scale division T of receiving grating 1.7. Let the period of the intensity pattern of the light irradiating receiving grating 1.7 be P. In scanning heads 1 having photosensitive areas arranged as receiving grating 1.7, because of the danger of cross feed between the photosensitive areas, scale division T has to be selected to be greater than period P. If four signals phase-shifted by 90 degrees are desired, the following applies $T=(2*n-1)*¼*P$(n is an integer greater than or equal to three).

For a period P=40 µm of the intensity pattern of the irradiated light, there thus comes about a scale division T of at least 50 µm. The individual phase-shifted signals are therefore gathered from four different periods of the intensity pattern, and thus also from different ranges of scale grating 2.2. Therefore, this type of patterned detector is designated as a four field sensor. It may have the disadvantage that contamination on the scale take effect on phase-shifted signals not at the same time, but offset in phase. This may result in inaccuracies during the evaluation of the phase-shifted signals.

Therefore, it is considered better to scan phase-shifted signals within a period P of the intensity pattern at receiving grating 1.7. One possibility for this is represented by the dual field sensor, illustrated in FIGS. 2a to 2e.

Figure 2A:
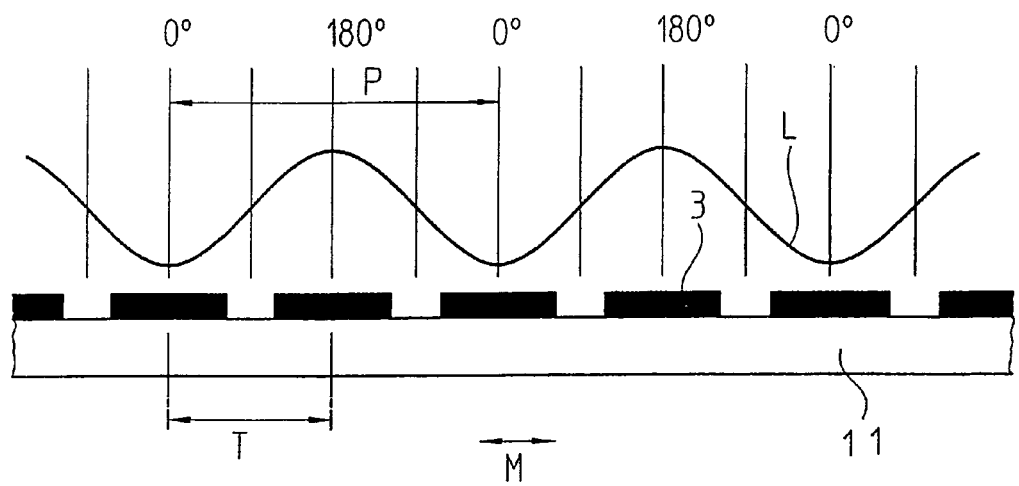
FIGS. 2a to 2e illustrate example embodiments of a dual field sensor.

Photosensitive areas 3 are schematically illustrated in FIG. 2a, whose design has already been shown in detail in FIGS. 1a to 1c. These photosensitive areas are arranged on substrate 1.1. Intensity pattern L having period P is schematically illustrated, and so is measuring direction M. One may see that, now within one period P, both a 0 degree signal and a 180 degree signal is able to be picked off. Adjacent photosensitive areas supply 180 degree phase-shifted signals if scale division T of receiving grating 1.7 corresponds to one-half of period P of incident, locally modulated intensity pattern L.

The following applies:

$$T = \frac{1}{2} * P.$$

Consequently, contamination on scale 2 will have an effect on both phase-shifted signals.

Figure 2B:
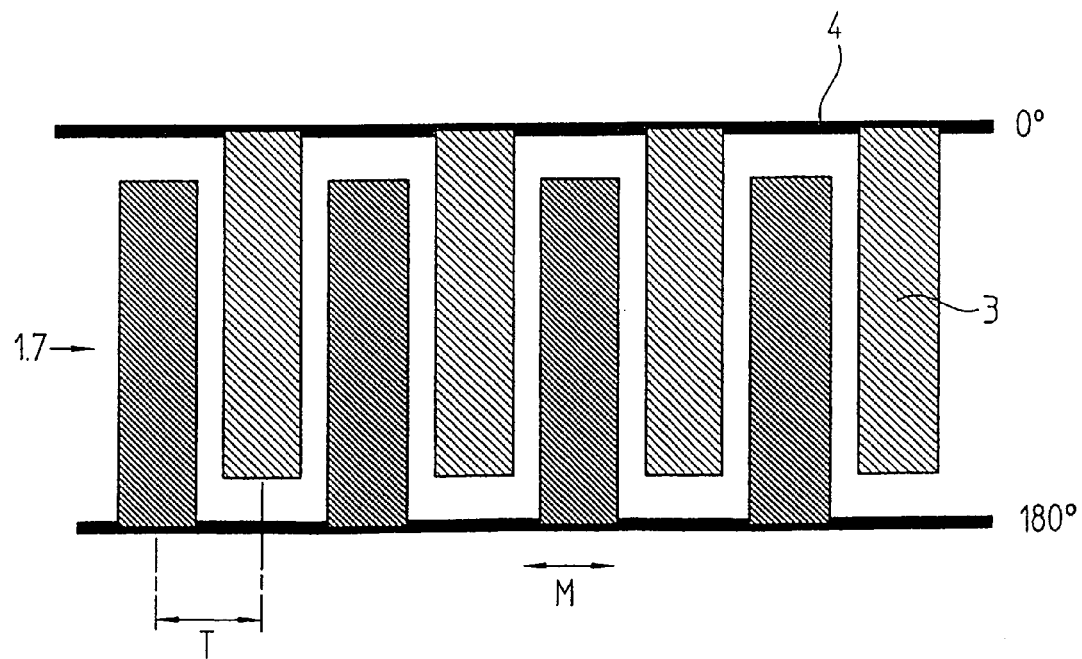

FIG. 2b illustrates how photosensitive areas 3 are able to be connected to one another by printed conductors 4, in order to combine several 0 degree signals and several 180 degree signals to a stronger output signal. In this context, a comb structure is created in each case. These comb structures intermesh, so that in each case photosensitive areas 3 for 0 degree signals and photosensitive areas 3 for 180 degree signals alternate. As illustrated in FIG. 2b, such a structure may be produced without crossed-over printed conductors.

Figure 2C:
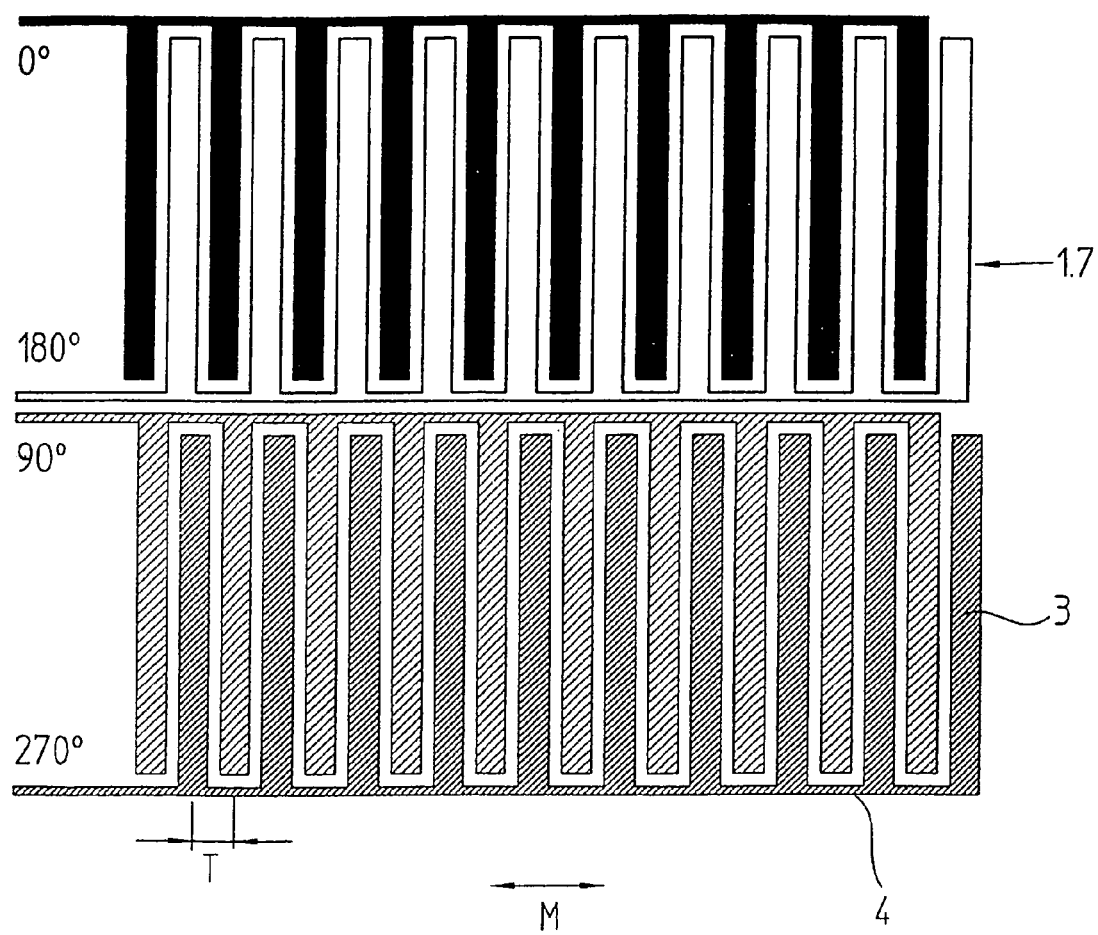

FIG. 2c illustrates how, using four comb structures, of which in each case two are interleaved according to FIG. 2b, four signals may be gathered that are phase-shifted by 90 degrees in each case. However, since two different ranges of the intensity pattern are scanned at receiving grating 1.7, this is referred to as a dual field sensor.

Figure 2D:
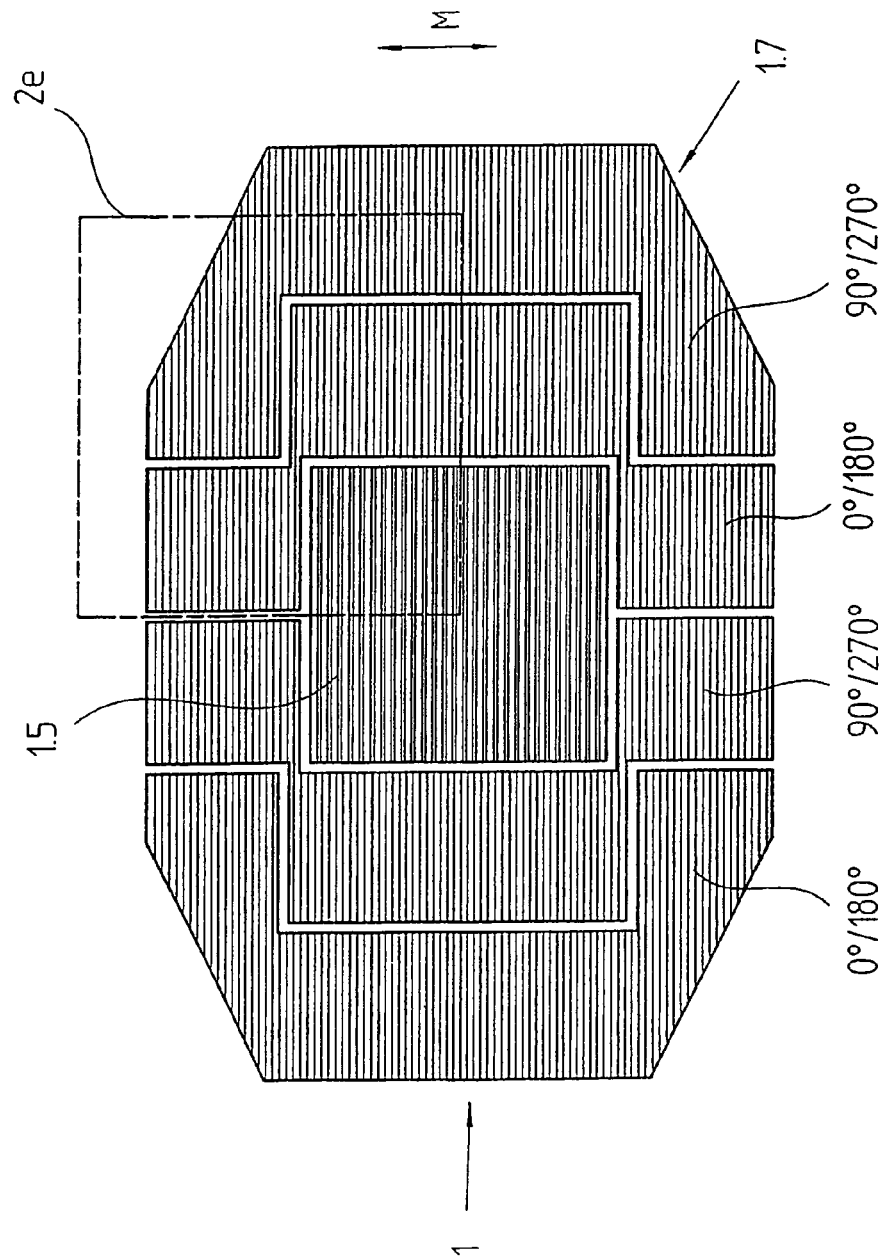
Figure 2E:
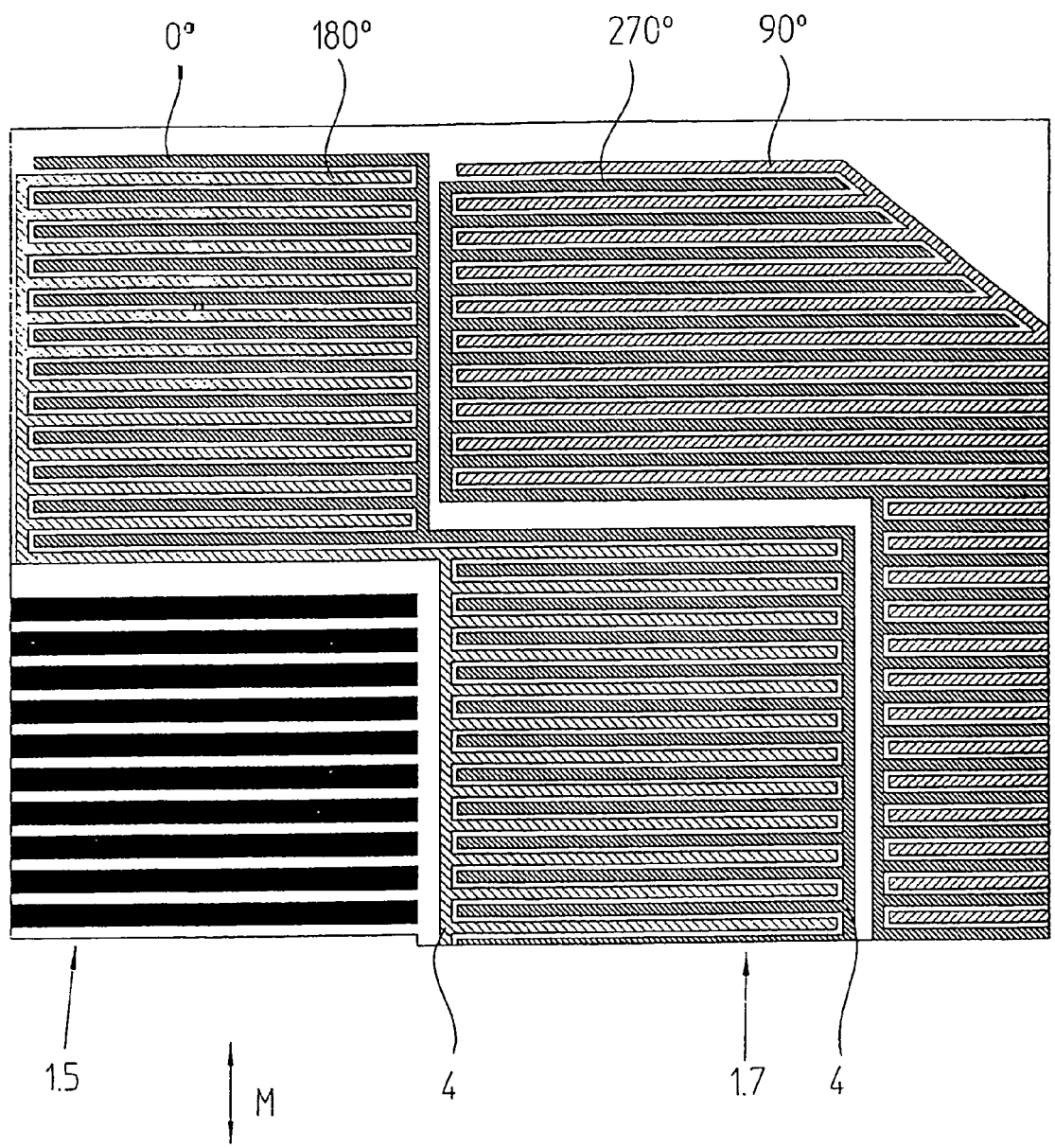

FIG. 2d illustrates an arrangement of such a scanning head 1 having a dual field sensor. Transmitting grating 1.5 is arranged at the center of the dual field sensor. By "center", the center of area of receiving grating 1.7 should be understood. Quadratic transmitting grating 1.5, in this context, is completely surrounded by receiving grating 1.7, in order to utilize as well as possible intensity pattern L. The grating lines of transmitting grating 1.5 and receiving grating 1.7 are perpendicular to measuring direction M. Receiving grating 1.7 is subdivided into four areas. Of the two inner areas, which border directly on transmitting grating 1.5, one is used for gathering 0 degree/180 degree signals, and the other of the two for gathering 90 degree/270 degree signals. An additional 90 degree/270 degree area, facing away from transmitting grating 1.5, borders on the inner 0 degree/180 degree area. An additional 0 degree/180 degree area, facing away from transmitting grating 1.5, borders on the inner 90 degree/270 degree area. This arrangement antisymmetric to the measuring direction makes certain that the four phase-shifted signals are picked up at comparable intensities.

The outer shape of entire receiving grating 1.7, that is composed of the four areas mentioned, as a rectangle having beveled corners, is approximated to an oval or an ellipse, whose greater diameter is perpendicular to measuring direction M. Such a shape may permit an especially good utilization of intensity pattern L at receiving grating 1.7.

The four different areas of receiving grating 1.7 illustrated in FIG. 2d are constructed by interleaved comb structures according to FIG. 2c. A cutout enlargement of FIG. 2d in FIG. 2e makes this clear. This dual field sensor, which may be very suitable in practice, may also therefore be produced without crossed-over printed conductors, which keeps the production process simple: Only one single metallization plane is required. With their patterning, photosensitive areas 3 are specified at the same time.

The dual field sensor described may provide that the amplitudes of the 0 degree/180 degree signals and the amplitudes of the 90 degree/270 degree signals are affected by possible contaminations simultaneously, and therewith in-phase. This may reduce the scanning ratio error and may increase the accuracy of the position determination as compared to a four field sensor. However, it is not the case, that all amplitudes of the four phase-shifted signals are impaired in-phase by contamination, so that the scanning is able to be further improved.

Figure 3A:
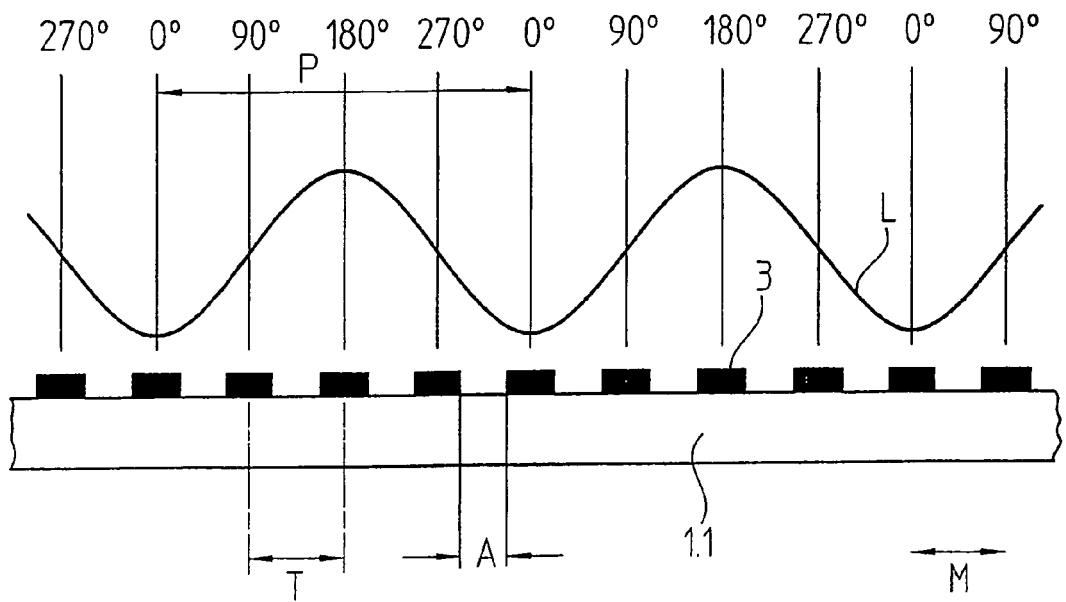
FIGS. 3a to 3d illustrate example embodiments of a single field sensor.

Further improved signals may be obtained from a scanning head 1 denoted here as a single field sensor. It is illustrated in FIG. 3a that, in such a single field sensor, in each case four phase-shifted signals are obtained from one single period P of intensity pattern L. Adjacent photosensitive areas supply 90 degree phase-shifted signals if scale division T of receiving grating 1.7 corresponds to one-quarter of period P of incident, locally modulated intensity pattern L. The following equation applies:

$$T = \frac{1}{4} * P.$$

Figure 3B:
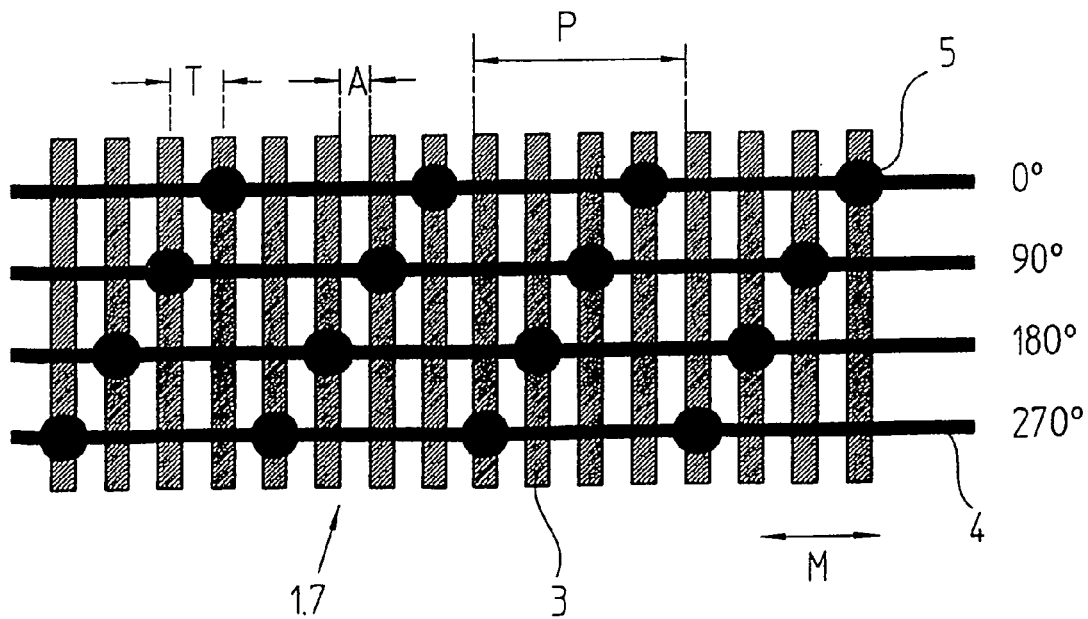

From the view in FIG. 3b it is illustrated that such a single field sensor may no longer do without crossed-over printed conductors. Photosensitive areas 3 do carry a bottom contact 1.4 on their reverse side, which is allowed to be connected to the printed conductors only at certain locations, using contacts 5. Between photosensitive areas 3 and printed conductors 4, an insulating layer thus has to be brought in which is only interrupted at contacts 5. Contact 5 is simply formed by printed conductors 4 coming into contact directly with bottom contacts 1.4, when the metal layer forming printed conductors 4 is deposited.

For a semiconductor layer stack 1.2 having the arrangement described herein, a separation distance A of 5 µm should be sufficient to avoid cross feed between the individual photosensitive areas 3. However, depending on the detector geometry and the semiconductor material, even shorter distances A in the µm range may lead to functional scanning heads 1. The minimum distance A is substantially determined by the diffusion length of the charge carrier in i-layer 1.2.2. The shorter this diffusion length is, the shorter may distance A be. Assuming a diffusion length of 50 nm for amorphous silicon, then no more cross feed should occur at a distance A of approximately 200 nm. However, since for technical process reasons (increasing expenditure and rising sensitivity to defects for smaller structures) greater distances A may be preferred, it may be stated that a meaningful lower boundary for distance A be may be approximately 1 µm.

For a period P=40 µm of the intensity-modulated light, for the four field sensor there comes about a scale division T of receiving grating 1.7 of 10 µm. Thus, at a distance A=5 µm, photosensitive areas 3 themselves are down to only 5 µm.

Figure 3C:
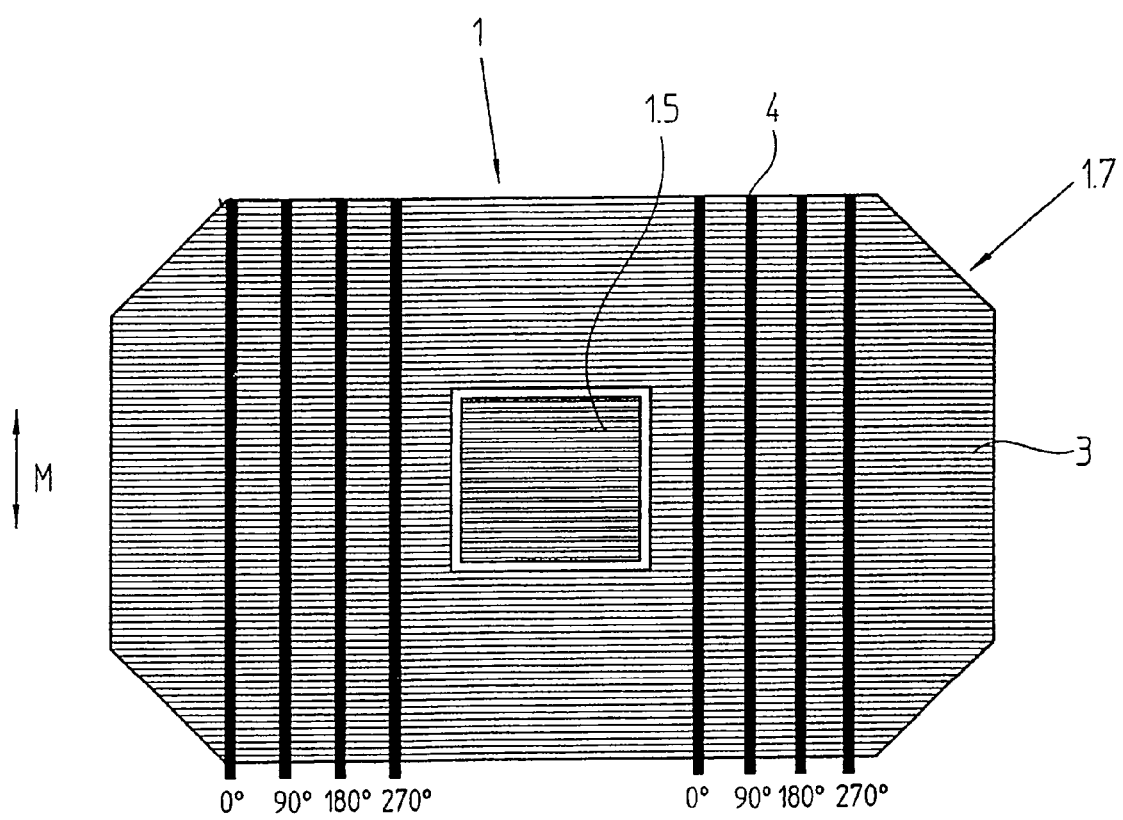

FIG. 3c illustrates an example embodiment of such a single field sensor. Again, a transmitting grating 1.5 is arranged in the center, or rather center of area, of receiving grating 1.7. Receiving grating 1.7, whose line direction, same as that of transmitting grating 1.5, again extends perpendicular to measuring direction M, has an outer shape approximating an ellipse, whose greater diameter is perpendicular to measuring direction M. Similar to FIG. 3b, receiving grating 1.7 is connected to printed conductors 4 that are transversely across receiving grating 1.7. Respectively four such printed conductors 4 are arranged on both sides of transmitting grating 1.5, so that they are also able to contact completely photosensitive areas 3 that are interrupted by transmitting grating 1.5.

Figure 3D:
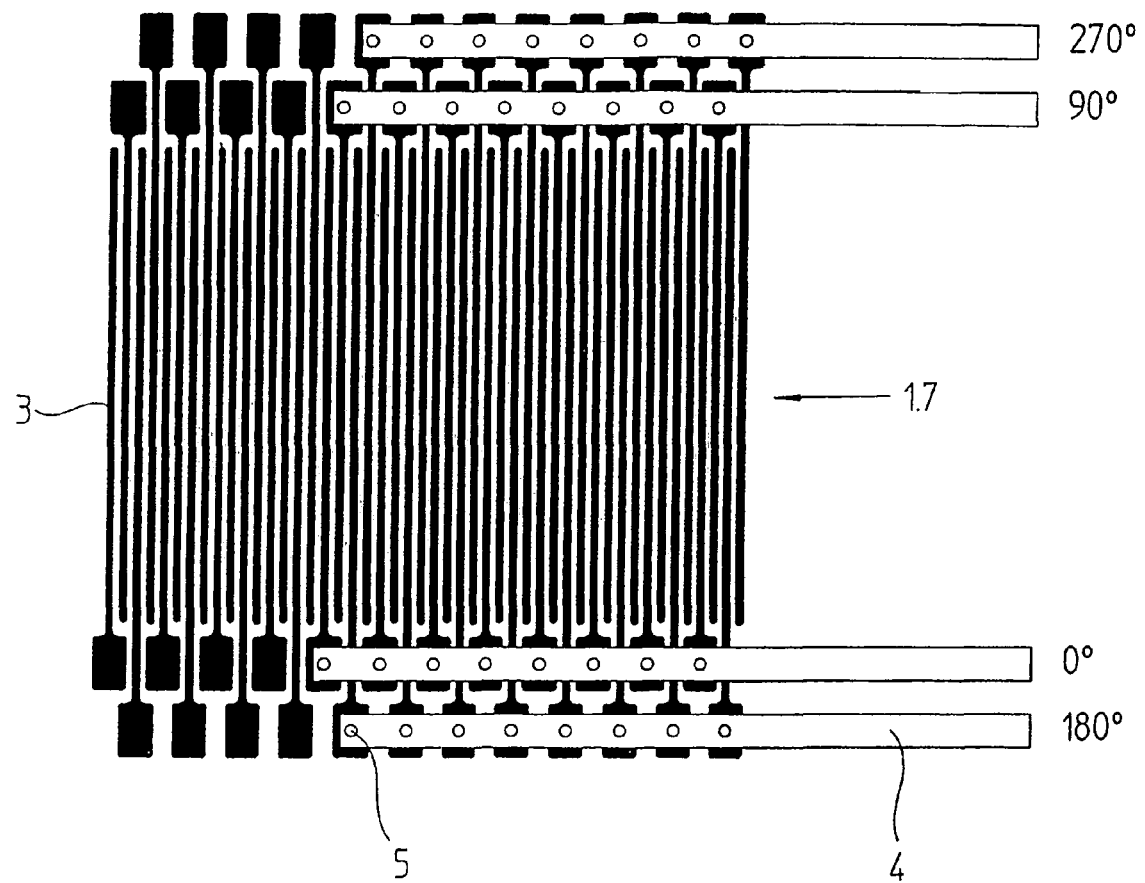

FIG. 3d illustrates an arrangement of the contact of photosensitive areas 3 that is to be recommended as an alternative, and especially so for small scale divisions T of receiving grating 1.7 of the single field sensor. At the edge of receiving grating 1.7, grating lines having enlargements are provided. Since every other grating line is lengthened, it is possible to make these enlargements twice as wide as the grating lines themselves. This may greatly simplify the contact of photosensitive areas 3 with printed conductors 4 via contacts 5. Again, it may be seen that such a single field sensor cannot be produced without crossover printed conductors 4.

It should still be mentioned that transmitting grating 1.5 may have the same layer construction as photosensitive areas 3. Since edges that are as sharply defined as possible are desirable for transmitting grating 1.5, semiconductor layer stack 1.2 is completely etched through in this region. However, it is also possible to develop transmitting grating 1.5 only as a patterned metal layer directly on substrate 1.1. In both cases, it is possible to perform the patterning of transmitting grating 1.5 and photosensitive areas 3 using the same lithography step.

What is claimed is:

1. A scanning head for an optical position-measuring system, comprising:
    a receiving grating including photosensitive areas adapted to scan locally intensity-modulated light of different phase position, the receiving grating including a semiconductor layer stack that includes a doped p-layer, an intrinsic i-layer and a doped n-layer;
    wherein the photosensitive areas have in common a first of the two doped layers and at least a part of the intrinsic layer and are electrically separated from one another by interruptions of a second of the two doped layers;
    wherein a shape of the receiving grating is approximately elliptical having a major axis perpendicular to a measuring direction of the position-measuring system.

2. The scanning head according to claim 1, wherein the semiconductor layer stack is arranged on a transparent substrate having a conductive and transparent electrode, followed by bottom contacts, to provide a layer construction in the following order:
    the transparent substrate;
    the conductive electrode;
    one of (a) the first doped layer and (b) the p-layer;
    the intrinsic layer;
    one of (a) the second doped layer and (b) the n-layer; and
    the bottom contact.

3. The scanning head according to claim 2, wherein the photosensitive areas are defined by the bottom contacts.

4. The scanning head according to claim 2, further comprising a transmitting grating arranged on the substrate.

5. The scanning head according to claim 4, wherein the transmitting grating is arranged in a center of an area of the receiving grating.

6. The scanning head according to claim 5, wherein the transmitting grating is completely surrounded by the receiving grating.

7. The scanning head according to claim 4, further comprising a light source assigned to the transmitting grating.

8. The scanning head according to claim 1, wherein adjacent photosensitive areas are adapted to emit signals phase-shifted by 180 degrees.

9. The scanning head according to claim 8, wherein a scale division of the receiving grating corresponds to one-half of a period of an incident, locally modulated intensity pattern.

10. The scanning head according to claim 1, wherein adjacent photosensitive areas are adapted to emit signals phase-shifted by 90 degrees.

11. The scanning head according to claim 10, wherein a scale division of the receiving grating corresponds to one-quarter of a period of an incident, locally modulated intensity pattern.

12. The scanning head according to claim 1, wherein the semiconductor layer stack is formed from amorphous silicon.

13. The scanning head according to claim 1, wherein a residual thickness of the i-layer between the photosensitive areas is less than a thickness of the i-layer in the photosensitive areas.

14. The scanning head according to claim 13, wherein the residual thickness of the i-layer is between 5% and 95% of the thickness of the i-layer.

15. The scanning head according to claim 13, wherein the residual thickness of the i-layer is between 10% and 90% of the thickness of the i-layer.

16. The scanning head according to claim 13, wherein the residual thickness of the i-layer is approximately 90% of the thickness of the i-layer.

17. The scanning head according to claim 1, wherein the semiconductor layer stack is arranged on a transparent substrate having a conductive and transparent electrode, followed by bottom contacts, to provide a layer construction in the following order:
    the transparent substrate;
    the conductive electrode;
    the first doped layer;
    the intrinsic layer;
    the second doped layer; and
    the bottom contact.

18. The scanning head according to claim 1, wherein the semiconductor layer stack is arranged on a transparent substrate having a conductive and transparent electrode, followed by bottom contacts, to provide a layer construction in the following order:
    the transparent substrate;
    the conductive electrode;
    the p-layer;
    the intrinsic layer;
    the n-layer; and
    the bottom contact.

19. The scanning head according to claim 1, wherein the measuring direction is perpendicular to grating lines of the receiving grating.

20. The scanning head according to claim 1, wherein the major axis is parallel to grating lines of the receiving grating.

* * * * *